United States Patent [19]

Neidig et al.

[11] Patent Number: 4,970,576
[45] Date of Patent: Nov. 13, 1990

[54] POWER SEMICONDUCTOR MODULE AND METHOD FOR PRODUCING THE MODULE

[75] Inventors: Arno Neidig, Plankstadt; Hubert Hettmann, Hockenheim, both of Fed. Rep. of Germany

[73] Assignee: Asea Brown Boveri Aktiengesellschaft, Mannheim, Fed. Rep. of Germany

[21] Appl. No.: 196,125

[22] Filed: May 19, 1988

[30] Foreign Application Priority Data

May 23, 1987 [DE] Fed. Rep. of Germany ....... 3717489

[51] Int. Cl.[5] ............................................. H05K 7/20
[52] U.S. Cl. ....................................... 357/74; 357/72; 361/386; 361/385
[58] Field of Search ........................... 357/72, 74, 81; 361/386, 389, 385

[56] References Cited

U.S. PATENT DOCUMENTS

| | | | |
|---|---|---|---|
| 3,889,365 | 6/1975 | Brock | 357/72 |
| 4,104,701 | 8/1978 | Baranowski | 361/389 |
| 4,558,510 | 12/1985 | Tani et al. | 357/72 |
| 4,636,580 | 1/1987 | Neidig et al. | 361/388 |
| 4,639,759 | 1/1987 | Neidig et al. | 357/80 |
| 4,670,771 | 6/1987 | Neidig et al. | 361/388 |
| 4,694,322 | 9/1987 | Sakurai et al. | 357/79 |
| 4,727,455 | 2/1988 | Neidig et al. | 361/385 |
| 4,731,644 | 3/1988 | Neidig | 357/72 |
| 4,768,075 | 8/1988 | Broich et al. | 357/81 |
| 4,788,626 | 11/1988 | Neidig et al. | 361/386 |

Primary Examiner—Andrew J. James
Assistant Examiner—Viet Q. Nguyen
Attorney, Agent, or Firm—Herbert L. Lerner; Laurence A. Greenberg

[57] ABSTRACT

A power semiconductor module and method for producing the module includes a plastic housing having a lower surface. An electrically insulating substrate having an upper surface is inserted in the lower surface of the plastic housing for supporting electrical components. A metallization is disposed at least on the upper surface of the substrate. The metallization on the upper surface of the substrate is patterned to form conductor tracks. Components are soldered onto the patterned metallization. Locating compartments disposed in the plastic housing form a soldering jig for the components during production of the module.

12 Claims, 6 Drawing Sheets

POWER SEMICONDUCTOR MODULE AND METHOD FOR PRODUCING THE MODULE

BACKGROUND OF THE INVENTION

1. Field of the Invention:

The invention relates to a power semiconductor module having a plastic housing, an electrically insulating substrate inserted in the lower surface of the plastic housing as a carrier for electrical components, a metallization disposed at least on the upper surface of the substrate, the metallization on the upper surface being patterned to form conductor tracks, and components such as semiconductor components and connecting elements soldered onto the patterned metallization. The invention also relates to a method for producing such a module.

2. Description of the Related Art:

Such a power semiconductor module is known from German Published, Non-Prosecuted Application DE-CS 36 04 313. The prior art power semiconductor module includes a plastic housing which is open at the bottom. A ceramic substrate which is used as the base surface has a patterned metallization on the upper surface thereof onto which the power semiconductor components and electrical connecting elements for internal module connections are soldered. In addition, connecting elements for external main terminals carrying load current are welded to the metallization of the substrate. The control terminals are so-called outlier terminals or terminals with a projecting tip because the projections thereof on the plane of the substrate lies outside the substrate area. The control terminals are soldered on in a second soldering step or inserted in tin bushings after wire connections have been produced with wire bonders. However, the connecting lugs for the main connections are soldered vertically onto the substrate in a standing position in the first soldering step, just as is the case in other conventional modules. In order to do this, an expensive welding jig or form is necessary in order to locate the connecting lugs in the required position during the soldering operation and to prevent them from tipping over.

Page 156 and FIG. 4e of the publication Electronic Design of Jan. 8, 1987 discloses a module producing process in which the connecting elements are soldered on in a recumbent or lying position. As a result of this on one hand, access is still made possible for a bonding tool after soldering and in addition, a soldering jig becomes unnecessary or at least only a simple alignment device is required. However, the connecting lugs have to be separated from a frame structure after soldering and bent upwards. This is a certain complication and may mechanically stress the solder joints.

SUMMARY OF THE INVENTION

It is accordingly an object of the invention to provide a power semiconductor module and method for producing the module, which overcomes the hereinafore-mentioned disadvantages of the heretofore-known methods and devices of this general type, which results in a simplification of the production and which, in particular, simultaneously renders positioning or alignment aids for the component parts unnecessary.

With the foregoing and other objects in view there is provided, in accordance with the invention, a power semiconductor module, comprising a plastic housing having a lower surface, an electrically insulating substrate having an upper surface and being inserted in the lower surface of the plastic housing for supporting electrical components, a metallization disposed at least on the upper surface of the substrate, the metallization on the upper surface of the substrate being patterned to form conductor tracks, components, such as semiconductor components and connecting elements, soldered onto the patterned metallization, and locating compartments such as recesses disposed or formed in the plastic housing forming a soldering jig or form for the components during production of the module.

In accordance with another feature of the invention, the housing is formed of a temperature-resistant plastic which withstands at least a temperature which is necessary for soldering to the substrate with soft solder.

In accordance with a further feature of the invention, the components include connecting lugs having a connecting part formed thereon, and the locating compartments have a cross-shaped structure as seen in a plan view, with a wide compartment part for guiding the connecting lugs and a narrow compartment part for guiding the connecting part.

In accordance with an added feature of the invention, the plastic housing is subdivided into a housing frame and a housing cover.

In accordance with an additional feature of the invention, the plastic housing includes a housing frame, and at least the housing frame is formed of a plastic with a melting point above 200° C. or a glass transition temperature above 100° C.

In accordance with yet another feature of the invention, there are provided plug connectors with a welded-on piece of wire forming control terminals.

In accordance with yet a further feature of the invention, the plug connectors are inserted in pockets formed in the housing frame.

In accordance with yet an added feature of the invention, the substrate is a ceramic substrate.

In accordance with yet an additional feature of the invention, the substrate is a metal substrate having an electrically insulating layer to which the conductor tracks are applied, and the conductor tracks are formed of copper.

With the objects of the invention in view, there is also provided a method for producing a power semiconductor module, which comprises: assembling and soldering semiconductor components on a substrate and producing required internal connections in a first soldering step; cementing the assembled substrate in a recess formed in a lower surface of a housing frame formed of temperature-resistant plastic; inserting connecting lugs in locating compartments disposed in the housing frame, placing a solder joint part of the connecting lugs against soldering portions of a metallization formed of copper areas on the substrate, inserting plug connectors in pockets formed in the housing frame, placing free ends of connecting leads on the plug connectors against several of the soldering portions carrying out a second soldering step and controlling the temperature of the second soldering step for preventing solderings of the first soldering step from remelting; and encapsulating the module and mounting a housing cover on the housing frame.

The method may also optionally include applying solder paste to the solder joint part, covering the soldering portions with solder before placing the solder joint part against the soldering portions, forming or welding the connecting leads on the plug connectors, applying solder paste on the free ends, and covering the soldering portions with solder before placing the free ends of the connecting leads against the soldering portions.

With the objects of the invention in view, there furthermore provided a method for producing a power semiconductor module, which comprises: printing a solderable metallized substrate with a solder paste cementing the printed substrate into a temperature-resistant plastic housing; mounting component parts on the substrate cemented into the housing carrying out a soldering process; and encapsulating the module.

According to one variant of the invention, it is proposed that the production be carried out in two soldering steps at different soldering temperatures, with no external connecting elements being fitted as yet in the first step. The substrate which is fitted with components and soldered in the first step, is readily accessible for bonding tools and testing devices. In the second soldering step, a suitably shaped part of the plastic housing is used as a soldering jig or form. That is to say, connecting elements are precisely aligned in the plastic housing. The plastic housing has a temperature-resistant structure so that a second soldering can be carried out in a continuous furnace and only an advantageously short pass time is necessary because the plastic housing has a low mass. Alternatively, the second soldering can advantageously also be carried out in such a way that only the base points of the connecting elements are heated for a short time to a temperature which is necessary for the soldering. In this case, the plastic housing is subjected to the lowest thermal stress and the soft solder may have the same melting point as in the first soldering. At the same time, plastic housings may also optionally be used which satisfy only the otherwise normal conditions relating to temperature resistance. After the second soldering, which is carried out at a lower temperature than the first soldering, the module is encapsulated in the normal manner and a cover with a spring lock is mounted thereon. Then connecting lugs which project through narrow openings in the cover matched to the cross section of the lugs may simply be bent over.

According to a second variant, it is proposed that a temperatureresistant plastic housing be provided which has recesses in which component parts such as semiconductor chips, connecting clips and plug connectors for external terminals, are aligned and held during a soldering step, for a module which does not require a wire bonding step.

Other features which are considered as characteristic for the invention are set forth in the appended claims Although the invention is illustrated and described herein as embodied in a power semiconductor module and method for producing the module, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
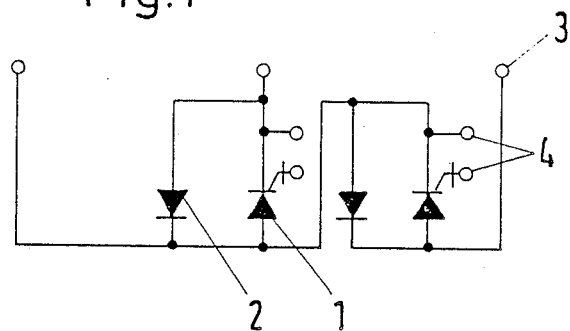
FIG. 1 is a schematic circuit diagram of a power semiconductor module shown in FIGS. 2 to 9.

Referring now to the figures of the drawings in detail and first, particularly, to FIG. 1 thereof, there is seen an underlying circuit diagram provided for a better understanding of the exemplary embodiment of a power semiconductor module shown in FIGS. 2 to 9. FIG. 1 shows that the power semiconductor module contains two gate turn-off thyristors 1, two diodes 2, three main terminals 3 and four control terminals 4.

Figure 2:
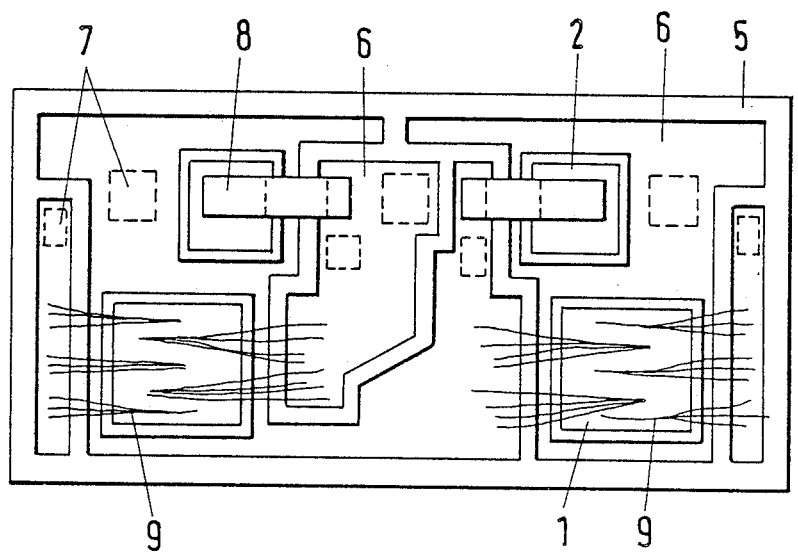
FIG. 2 shows is a diagrammatic plan view of a ceramic substrate with components mounted thereon.

FIG. 2 shows a ceramic substrate 5 of aluminum oxide which contains copper areas 6 applied as conductor tracks or strip conductors by a direct bonding method. The gate turn-off thyristors 1 and diodes 2 are soldered onto the copper areas 6. Soldering areas or portions 7 on the copper area 6 are prewetted with soldering material in a first production step. Connecting elements are subsequently soldered onto the soldering areas 7. FIG. 2 furthermore shows clips 8 which have been soldered on and with which electrical connections are produced between the diodes 2 and the copper areas 6. Finally, wire connections 9 which have been produced by ultrasonic thick-wire bonding are shown between the thyristors 1 and copper areas 6.

Figure 3:
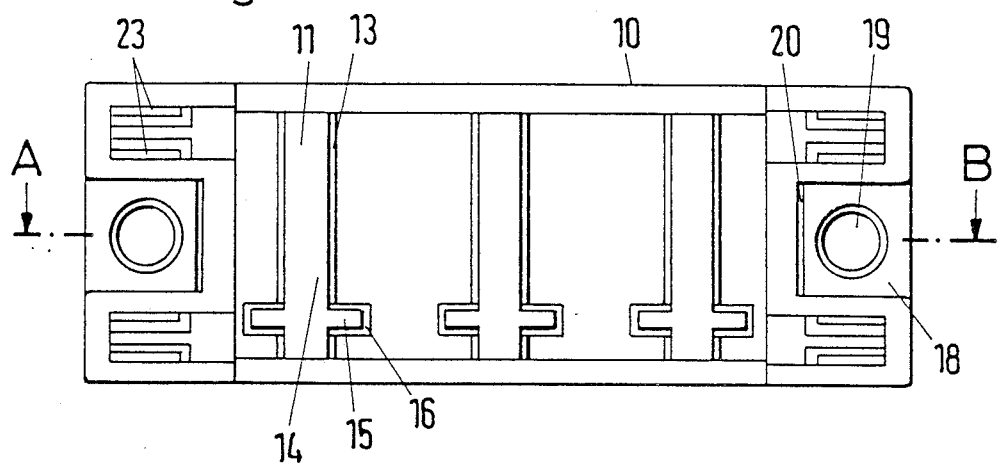
FIG. 3 is a plan view of a plastic housing frame.
Figure 5A:
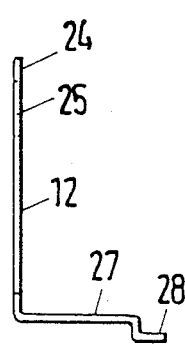
FIG. 5a is a side-elevational view of a connecting lug.
Figure 5B:
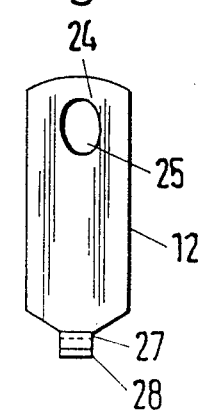
FIG. 5b is a front-elevational view of the connecting lug.
Figure 7:
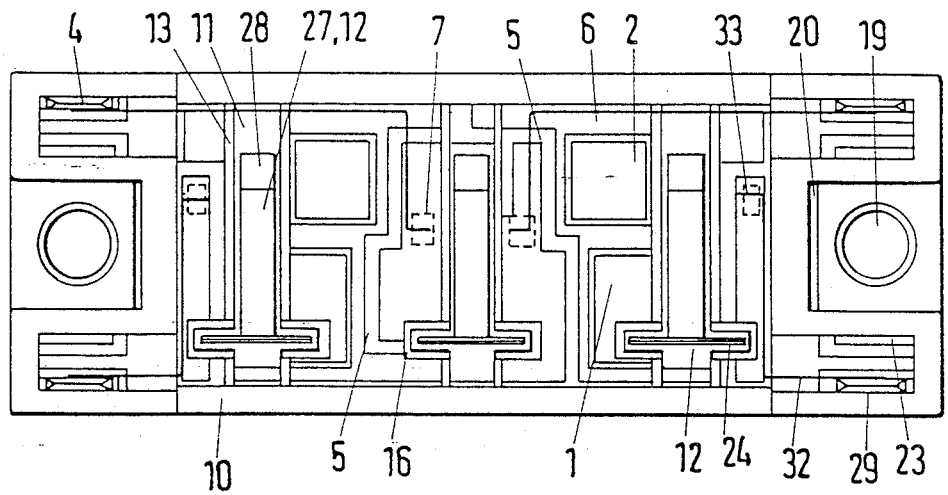
FIG. 7 is a plan view of the housing frame with a ceramic substrate inserted in the base, after connecting lugs and plug connectors have been mounted.

FIG. 3 shows a plan view of a housing frame 10 formed of a temperature-resistant plastic. The part of the housing designated as the housing frame 10 has a structure essential to the invention in the from of partitions 13 defining locating or guiding compartments 11. Connecting lugs 12 shown in FIGS. 5a and 5b are inserted in the locating or guiding compartments 11 during the module production, as shown in FIG. 7.

Figure 4:
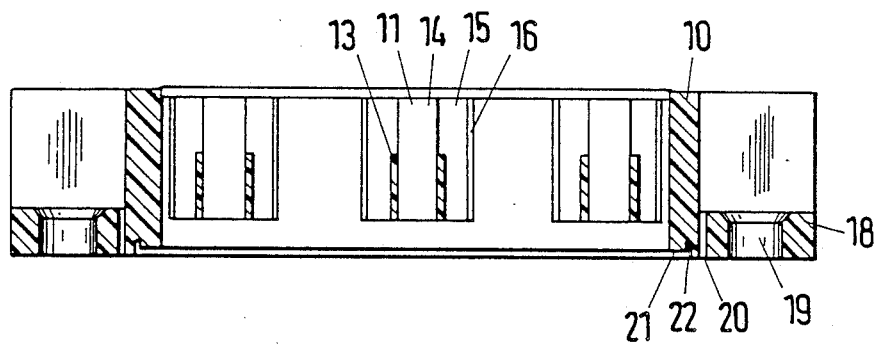
FIG. 4 is a cross-sectional view of the housing frame taken along the line A–B in FIG. 3, in the direction of the arrows.
Figure 8:
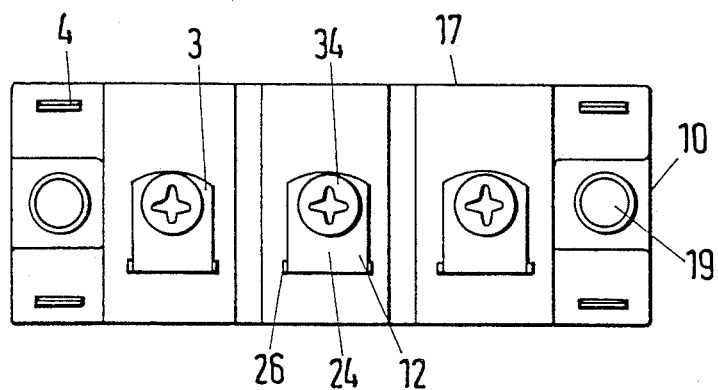
FIG. 8 is a plan view of the finished power semiconductor module provided with a plastic cover.
Figure 9:
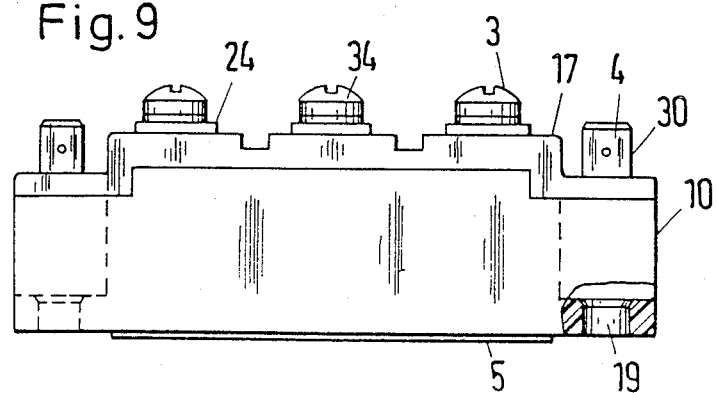
FIG. 9 is a side-elevational view of the finished power semiconductor module.

The shape of the locating compartments 11 formed by the partitions 13 becomes clearer by viewing 4 as well. FIG. 4 shows a section through the plane A–B of the housing frame 10 indicated in FIG. 3. It is evident from FIGS. 3 and 4 that in each case a locating compartment 11 is formed of a narrow compartment part 14 and a wide compartment part 15. In addition, FIG. 4 shows that the wide compartment part 15 is higher than the narrow compartment part 14. The wide compartment part 15 is formed by a section 16 molded-on the partition 13. Two partitions 13 with molded-on sections 16 are constructed as mirror images and are disposed at a suitable distance from each other, so that the cross-shaped locating compartments 11 with the narrow and wide parts 14 and 15 are produced. As can be seen from FIG. 4, the partitions 13 are only situated approximately in a central third of the height of the housing frame 10. As a result of this configuration, a space remains free below the partitions 13 for the components 1, 2 which are not shown in FIG. 4 but are disposed on the substrate 5 to be inserted in the base plane of the frame 10. The wide compartment part 15 formed by the molded-on sections 16 extends to the top edge of the frame 10, onto which a housing cover 17 shown in FIGS. 8 and 9 is clipped.

Further details of the housing frame 10 which are known from the prior art, can be seen in FIGS. 3 and 4. Fixing flanges 18 with holes 19 for fixing screws are molded or formed on the housing frame 10. Slots 20 are provided in the vicinity of the flanges 18 in order to prevent the transmission of mechanical stresses to the substrate 5 from the vicinity of the fixing screws. A recess 21 for receiving the substrate 5 and a groove 22 in the recess 21 for receiving adhesive residues, are formed in the bottom of the frame 10.

In addition, molded or formed-on pockets 23 can be seen in the plan view of FIG. 3. The pockets 23 are provided for locating plug connectors 29 shown in FIG. 6a which form the control terminals 4.

FIGS. 5a and 5b show the previously-mentioned connecting lugs 12 in side and front views. Upper lug parts 24 of the lugs 12 have an elongated hole 25. After the housing cover 17 has been mounted, the upper lug part 24 projects through a narrow opening 26 in the cover 17 and is bent over at that point, as shown in FIG. 8.

In addition to the wide upper lug part 24 with the elongated hole 25, the connecting lug 12 shown in FIGS. 5a and 5b has an angled narrow connecting part 27 with a solder joint part formed by a Z-shaped angulation.

Figure 6A:
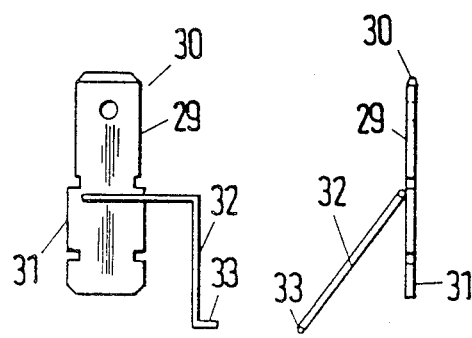
FIG. 6a is a front-elevational view of a plug connector with a connecting wire welded thereon.
Figure 6B:
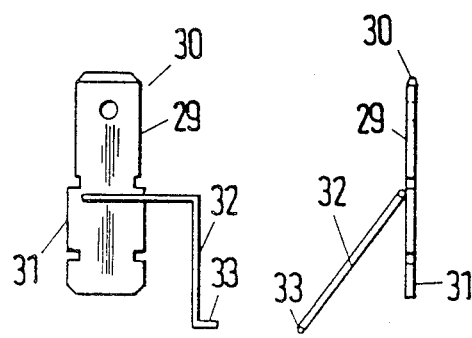
FIG. 6b is a side-elevational view of the plug connector with the wire.

FIGS. 6a and 6b show the plug connectors 29 mentioned above for the control connections 4. The plug connectors 29 have a tab connector part 30 and a base part 31 by means of which they are inserted into one of the pockets 23 of the housing frame 10. A doubly angled piece of wire 32 is welded onto the base part 31. The piece of wire 32 is bent in such a way that a free end 33 thereof is up against a solder area 7 provided on the substrate 5 after the plug connector 29 is inserted into a pocket 23.

FIG. 7 again shows a plan view of the housing frame 10, but after the assembled substrate 5 has been cemented into the lower surface of the frame 10, the connecting lugs 12 have been placed in the locating compartments 11 and the plug connectors 29 have been inserted in the pockets 23. For the sake of clarity, the wire connections 9 and the clips 8, which can be seen in FIG. 2, are not shown in FIG. 7.

FIG. 8 is a plan view of the housing cover 17 which is clipped onto the housing frame 10. The three upper lug parts 24 projecting through the narrow openings 26 in the cover 17 are bent over. Nuts into which screws 34 are screwed to form the main terminals 3, are placed below the elongated hole 25 in the lug part 24. Finally, FIG. 9 additionally shows a side view of the finished module.

A method for producing the power semiconductor module shown in the drawings is described below.

The starting point is a substrate 5 which is formed of $Al_2O_3$ ceramic and is provided with copper areas 6 as conductor tracks. The copper areas 6 are joined to the ceramic substrate 5 by a conventional direct bonding method. Thyristors 1, which in this case are GTO thyristors, and diodes 2 as well as clips 8 are soldered onto the copper areas 6. This soldering is carried out with a high-melting solder at about 300° C., for example, in a continuous furnace. In addition, areas 7 in FIG. 2 are prewetted with low-melting solder material, such as PbSn 60, in preparation for a subsequent soldering step. Wire connections 9 are produced by ultrasonic wire bonding between cathode and gate fingers on the gate turn-off thyristors 1 and copper areas 6. Obviously, wire connections 9 can also be used for making contact to the diodes 2 instead of the clips 8. This produces the substrate with mounted components as shown in FIG. 2, which can be pretested in relation to important electrical parameters.

The substrate 5 with components mounted thereon to this extent, is cemented into the recess 21 provided in the lower surface of the housing frame 10 shown in FIGS. 3 and 4, by means of an elastic silicone rubber which avoids mechanical stresses between the substrate and housing. However, as an alternative it is also possible to first solder the substrate 5 onto a non-illustrated solid copper base plate and only then cement it into the housing frame 10.

The housing frame 10 is formed of a temperature-resistant plastic so that it is not destroyed in the subsequent second soldering step. A partially crystalline thermoplastic polyester having a melting point between 200° C. and 260° C., for example, is suitable.

After the adhesive has set, the connecting lugs 12 shown in FIGS. 5a and 5b are inserted into the locating compartments 11, as shown in FIG. 7. The locating compartments 11 act as soldering jigs or forms in the second soldering step. In each case a solder joint part 28 of the connecting lugs 12 is up against a soldering area 7 on the copper areas 6. In order to ensure good wetting, the connecting lugs can be nickel-plated, silver-plated or tin-plated beforehand.

In addition, as shown in FIG. 7, the plug connectors 29 shown in FIGS. 6a and 6b are inserted in to the pockets 23 and the welded-on pieces of wire 32 are aligned in such a way that in each case the free end 33 thereof is up against a soldering area 7. The pieces of wire 32 may be nickel-plated, silver-plated or tin-plated to obtain optimum soldering. The pieces of wire 32 are preferred as connecting elements between copper areas 6 and the plug connectors 29 because they make it possible to match different layouts of the substrate 5 provided with copper areas 6 by simply bending the wire.

It should be noted that a number of variations are possible depending on the number of pieces required and the economic efficiency. Thus, instead of the pieces of wire 32, a connecting element may already be directly molded or formed on when the plug connectors 29 are punched and obtained from the manufacturer of the plug connector in this construction. Instead of the soldering areas 7 provided on the copper areas 6, it may also be adequate to provide the solder joint part 28 of the connecting lug 12 and also the free ends 33 of the pieces of wire 32 with drops of flux-containing solder paste that are dried. It is also possible to obtain the housing frame 10 from the supplier with lugs 12 and plug connectors 29 already inserted and solidly connected to the frame 10, so that it is no longer necessary to insert those parts.

The connecting lugs 12 and pieces of wire 32 are connected to the copper areas 6 in a second soldering step. If prewetted soldering areas 7 have been provided, the soldering process is expediently carried out in a continuous furnace with a maximum soldering temperature of 220° .C in a reducing atmosphere. In a continuous furnace employing infrared lamp heating, it is possible, for example, to achieve short soldering times of 1 to 2 minutes since the plastic housing 10 and the substrate 5 have a low mass. It is equally possible to use vapor-phase soldering baths, for example, employing FC-70 supplied by the firm 3M as the boiling liquid with a boiling point of 215° C. However, other soldering methods may also be employed, such as soldering by punctiform or pointwise heating of the solder joint by means of a laser beam or by means of so-called pulse reflow using resistance-heated pressure-application probes. In this case, the plastic parts are exposed to the lowest thermal stresses so that it is also possible to use less temperature-stable plastics.

As the final manufacturing step, the module which has been completed to this extent is filled with soft silicone encapsulant and then with epoxy resin in the conventional manner and the plastic housing cover 17 is clipped on. Nuts are placed in the cover 17 in the recesses provided at the locations of the main terminals 3 and the upper lug parts 24 projecting out of the cover are bent over so that the elongated hole 25 in the lug part 24 is located above a nut in each case, and a screw 34 can be screwed in.

A second exemplary embodiment is shown in FIGS. 10 to 16. The second embodiment relates to a power semiconductor module in which the plastic housing acts not only as soldering jig for assembling external terminals but also as soldering jig for semiconductor chips and clips for connections inside the module. A structure similar to the illustrated module is already known from German Published, Non-Prosecuted Application DE-OS 36 10 288. However, the housing cannot be used as a soldering jig in the prior art module. The module represents the structure of a single-phase rectifier.

Figure 10:
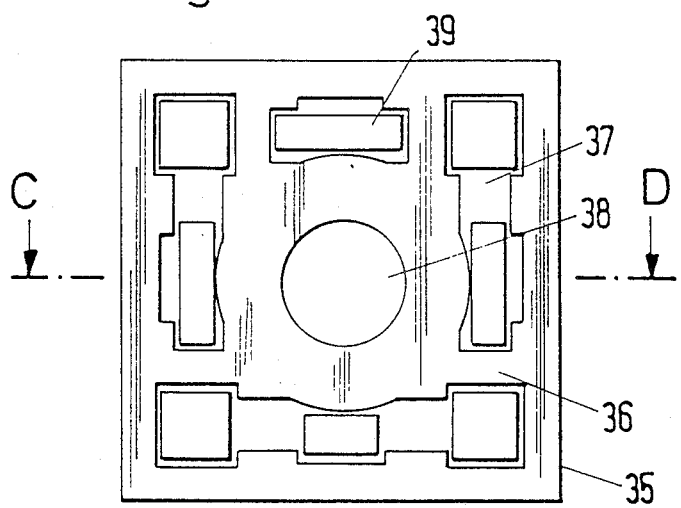
FIG. 10 is a plan view of a second embodiment of a substrate for a single-phase rectifier module shown in FIGS. 15 and 16.

FIG. 10 shows a plan view of a substrate 35 which in this embodiment is not formed of ceramic but instead is a metal plate, for example an aluminum sheet, which is coated with an insulating layer 36 that is formed of polyimide or epoxy resin, for example. The insulating layer 36 has an adequate electrical insulation capability (for example, a voltage endurance of 3 kV for a duration of 1 second) with good heat conduction at the same time. In addition, a patterned or structured copper layer 37 is applied to the insulating layer 36. Such metal substrates with an insulating layer and copper layers are offered on the market, such as the product Hitt-Plate supplied by the firm Denka. A description of the method of producing such substrates is therefore unnecessary.

The substrate 35 in the second embodiment has a square structure and has an opening 38 in the center, since the module is intended to be held or fixed with a central screw correspondingly disposed in the middle. The plan view of FIG. 10 furthermore reveals areas 39 which have solder paste 40 (FIG. 11) printed thereon.

The areas 39 are those areas onto which component parts are to be soldered in a subsequent operation. The areas 39 are printed with the solder paste 40 containing flux, for example by a screen printing method. The solder paste 40 is dried on. This drying process can be carried out at the same time as another process, namely the curing of the adhesive with which the substrate 35 is cemented into a plastic housing 45 shown in FIG. 14.

Figure 11:
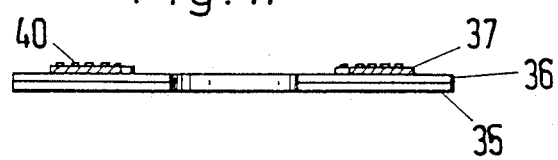
FIG. 11 is a cross-sectional view taken along the line C–D of FIG. 10, in the direction of the arrows.

FIG. 11 shows the substrate 35 along a section taken through the section plane C-D in FIG. 10. The substrate 35 may, for example, be formed of an aluminum plate that is about 1 mm thick, the insulating layer 36 may be 70 $\mu$m thick and the copper layer 37 may be about 35 $\mu$m thick.

Figure 12:
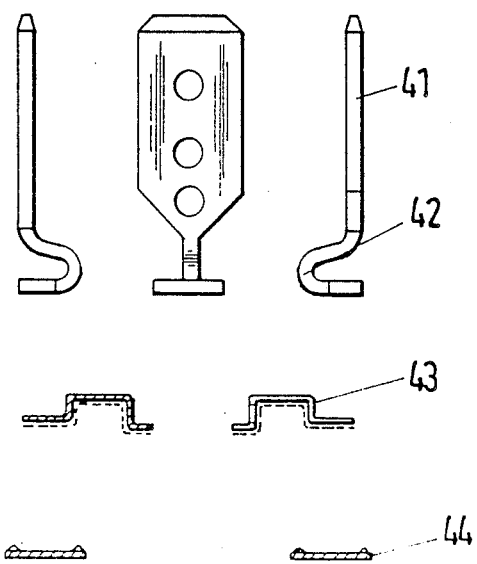
FIG. 12 is an exploded view of component parts for the module of the second embodiment.

FIG. 12 shows parts which are to be mounted on the substrate, namely a flat or tub plug connector 41 with expansion loops 42, clips 43 for connections inside the module and semiconductor chips 44.

Figure 13:
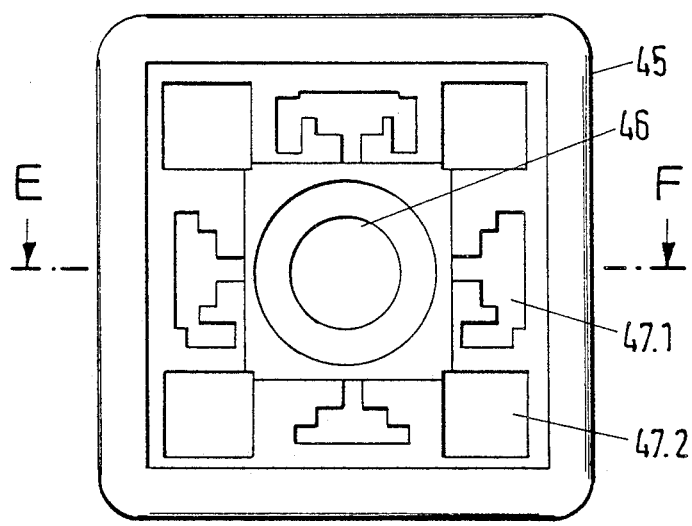
FIGS. 13 is a plan view of a plastic housing for the module of the second embodiment.
Figure 14:
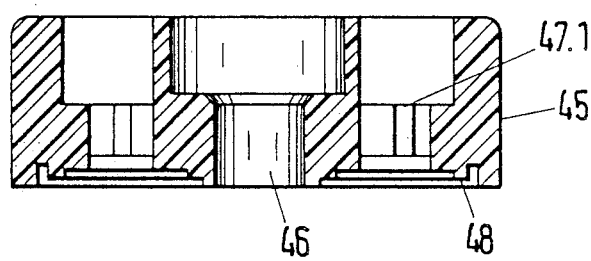
FIG. 14 is a cross-sectional view taken along the line E–F of FIG. 13, in the direction of the arrows.

FIG. 13 shows a plan view of the plastic housing 45. FIG. 14 shows a section through the plastic housing 45 taken along the section plane E-F in FIG. 13.

Figure 15:
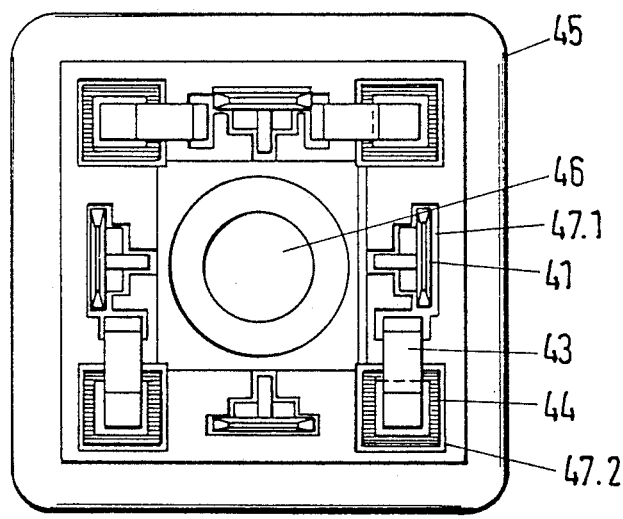
FIG. 15 is a plan view of a module with mounted components.

As seen in FIG. 15, in addition to a central hole 46 for a fixing screw, the plastic housing 45 contains locating compartments in the form of specially shaped recesses 47.1 and 47.2 which are provided for positioning the component parts 41, 43 and 44 and for location during the soldering process. In this connection, the recesses 47 1 are suitable for locating the plug connectors 41 and the recesses 47.2 for locating the semiconductor chips 44. The clips 43 are in each case passed through a recess 47.1 and a recess 47.2. Just like the housing 10 described with regard to the first embodiment, the plastic housing 45 must be temperature-resistant. A recess 48 shown in FIG. 14 is provided in the lower surface of the plastic housing 45 for inserting the substrate 35.

The substrate 35 may be cemented into the plastic housing 45, such as with a silicone rubber which hardens at elevated temperature. Components are then mounted on the module from above through the recesses 47.1 and 47.2 in the housing. First the semiconductor chips 44 are inserted, then the clips 43 and finally the flat or tub plug connectors 41. These parts, which are optionally covered beforehand with solder, are consequently disposed up against the areas 39 on the substrate 35 which have been previously covered with solder paste 40 and are aligned by the recesses 47.1 and 47.2. The module with components mounted thereon is shown in FIG. 15.

Figure 16:
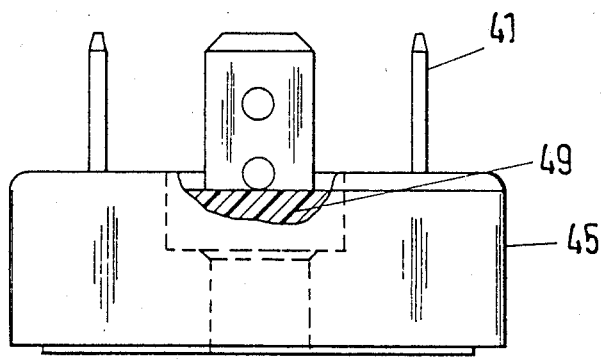
FIG. 16 is a partly broken-away side-elevational view of an encapsulated module.

Eutectic PbSn is preferably used as the solder material. The module with components mounted thereon is then soldered in a continuous furnace employing infrared heating. After soldering, flux residues are removed by washing in a solvent. Finally, the module is filled in a conventional manner with an encapsulating compound 49 up to a filling height which can be seen in FIG. 16, i.e. somewhat below the upper housing edge. FIG. 16 shows the finished module.

The foregoing is a description corresponding in substance to German Application P 37 17 489.4, dated May 23, 1987, the International priority of which is being claimed for the instant application, and which is hereby made part of this application. Any material discrepancies between the foregoing specification and the aforementioned corresponding German application are to be resolved in favor of the latter.

We claim:

1. Power semiconductor module, comprising a plastic housing having a lower surface, an electrically insulating substrate having an upper surface and being disposed on said lower surface of said plastic housing for supporting electrical components, a metallization disposed at least on said upper surface of said substrate, said metallization on said upper surface of said substrate being patterned to form conductor tracks, electrical components soldered onto said patterned metallization with soft solder having a given soldering temperature, and locating compartments disposed in said plastic housing forming a soldering jig for said electrical components during production of the module, said housing being formed of a temperature-resistant plastic which withstands a temperature at least as high as said given soldering temperature.

2. Power semiconductor module according to claim 1, wherein said components are semiconductor components and connecting elements for plug connectors being soldered onto said patterned metallization.

3. Power semiconductor module according to claim 1, wherein said locating compartments are in the form of recesses formed in said plastic housing.

4. Power semiconductor module according to claim 1, wherein said components include connecting lugs having a lug part and a connecting part formed thereon, and said locating compartments have a cross-shaped structure as seen in a plan view, with a wide compartment part for guiding said lug part and a narrow compartment part for guiding said connecting part.

5. Power semiconductor module according to claim 1, wherein said plastic housing is subdivided into a housing frame and a housing cover.

6. Power semiconductor module according to claim 1, wherein said plastic housing includes a housing frame and other parts of said housing, and at least said housing frame is formed of a plastic with a melting point above 200° C.

7. Power semiconductor module according to claim 1, including control terminals having plug connectors with a welded-on piece of wire connected to said patterned metallization.

8. Power semiconductor module according to claim 7, wherein said plug connectors are inserted in pockets formed in said housing frame.

9. Power semiconductor module according to claim 1, wherein said substrate is a ceramic substrate.

10. Power semiconductor module according to claim 1, wherein said substrate is a metal substrate having an electrically insulating layer to which said conductor tracks are applied, and said conductor tracks are formed of copper.

11. Power semiconductor module according to claim 1, wherein said locating components are also formed of said temperature- resistant plastic.

12. Power semiconductor module according to claim 1, wherein said locating components are formed directly in said plastic housing.

* * * * *